(12) United States Patent
Cai

(10) Patent No.: US 6,914,550 B2
(45) Date of Patent: Jul. 5, 2005

(54) DIFFERENTIAL PIPELINED ANALOG TO DIGITAL CONVERTER WITH SUCCESSIVE APPROXIMATION REGISTER SUBCONVERTER STAGES USING THERMOMETER CODING

(75) Inventor: Qi Cai, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/682,167

(22) Filed: Oct. 9, 2003

(65) Prior Publication Data

US 2005/0078025 A1 Apr. 14, 2005

(51) Int. Cl.[7] ............................................... H03M 1/12
(52) U.S. Cl. ........................ 341/155; 341/172; 341/150
(58) Field of Search ................................. 341/155, 156, 341/118, 122, 120, 126, 161, 172, 150, 163

(56) References Cited

U.S. PATENT DOCUMENTS

| 4,611,196 | A | | 9/1986 | Fernandez |
| 5,861,828 | A | | 1/1999 | Opris |
| 6,124,818 | A | * | 9/2000 | Thomas et al. ............. 341/155 |
| 6,166,675 | A | | 12/2000 | Bright |
| 6,195,032 | B1 | | 2/2001 | Watson et al. |
| 6,222,478 | B1 | | 4/2001 | Bright |
| 6,285,309 | B1 | | 9/2001 | Yu |
| 6,373,424 | B1 | | 4/2002 | Soenen |
| 6,400,302 | B1 | * | 6/2002 | Amazeen et al. ........... 341/172 |

* cited by examiner

Primary Examiner—Michael Tokar
Assistant Examiner—John B Nguyen
(74) Attorney, Agent, or Firm—Ronald O. Neerings; Wade James Brady, III; Frederick J. Telecky, Jr.

(57) ABSTRACT

Pipelined analog to digital conversion systems are provided having cascaded multi-bit successive approximation register subconverter stages using thermometer coding. Capacitor arrays are provided in the subconverter stages, where switching logic selectively couples the capacitors to operate in sample, conversion, and residue amplification modes for generating multi-bit subconverter digital outputs and analog subconverter residue outputs, wherein the capacitors are switched according to a thermometer code to reduce differential converter non-linearity.

18 Claims, 11 Drawing Sheets

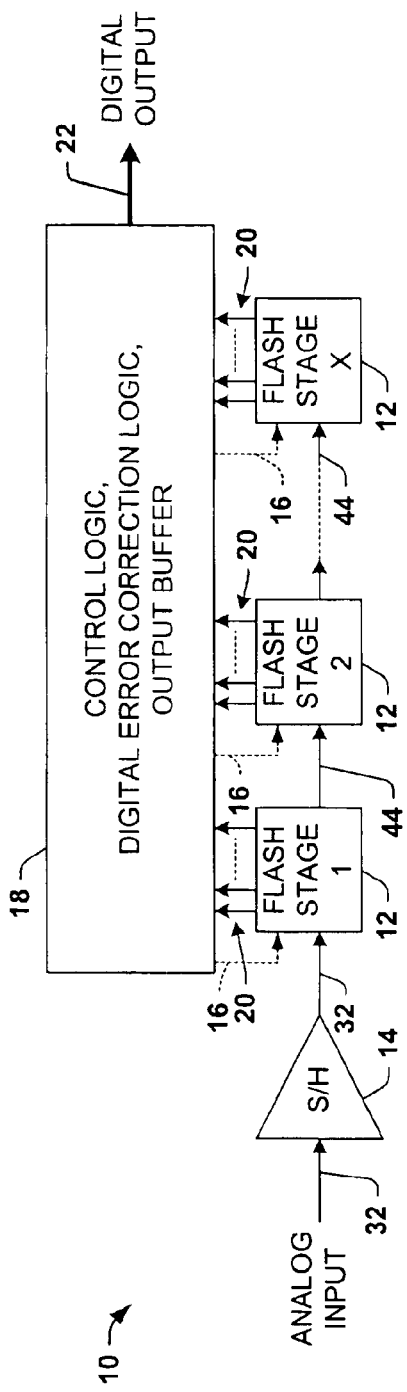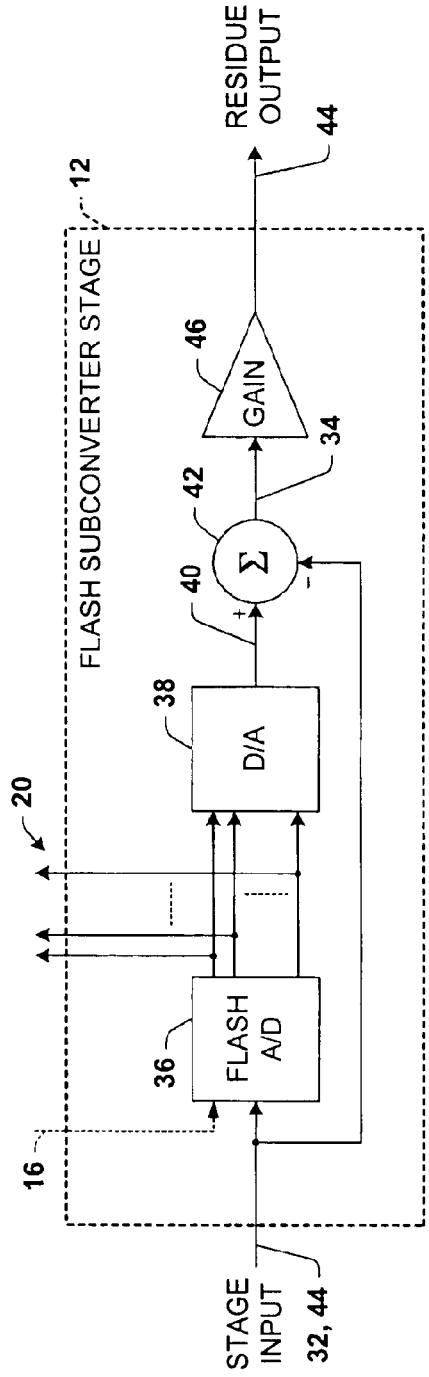
FIG. 1A (PRIOR ART)
FIG. 1B (PRIOR ART)

DIFFERENTIAL PIPELINED ANALOG TO DIGITAL CONVERTER WITH SUCCESSIVE APPROXIMATION REGISTER SUBCONVERTER STAGES USING THERMOMETER CODING

RELATED APPLICATIONS

This application is related to U.S. patent application Ser. No. 10/682,301, filed on Oct. 9, 2003, entitled DIFFERENTIAL PIPELINED ANALOG TO DIGITAL CONVERTER WITH SUCCESSIVE APPROXIMATION REGISTER SUBCONVERTER STAGES.

FIELD OF INVENTION

The present invention relates generally to signal processing, and more particularly to a pipeline analog to digital data converter having pipelined fully differential multi-bit successive approximation register subconverter stages.

BACKGROUND OF THE INVENTION

Wireless communications products and other modern electronic devices typically process and generate both digital and analog signals. To perform their intended functions, these systems often convert analog signals into digital signals, referred to as analog to digital (A/D) conversion. Accordingly, these systems require circuitry to interface signals from the analog domain to signals in the digital domain so that they may perform further digital signal processing. In particular, analog to digital conversion systems (A/D converters, or ADCs) are needed to interface the analog and digital domains.

Advances in wireless communications devices, DVD systems, and other related technologies indicate a need for increased sampling/conversion rates in analog-to-digital conversion systems, along with high resolution. At the same time, however, power consumption is an important design consideration, wherein portable devices need to perform high-resolution analog to digital conversions while consuming a minimal amount of power. Other important performance parameters for A/D converters include differential nonlinearity (DNL) and bandwidth, where the system conversion speed are improved with increased bandwidth. In the past, "flash" type A/D converters have been employed where fast conversions are needed. Flash converters provide a multi-bit digital output value in a single conversion cycle. However, flash converters require a large number of comparator circuits. As a result, flash type converters occupy a large amount of area in an integrated circuit, and also consume a relatively high amount of power.

Pipelined converters attempt to reduce die area and power requirements while sacrificing some conversion speed for high-resolution A/D conversion, wherein 2–4 bit flash type A/D converter stages are cascaded to provide high-resolution conversion. FIGS. 1A–1C illustrate a conventional pipelined A/D conversion system 10 that includes an integer number "X" cascaded flash type subconverter stages 12, with a sample and hold (S/H) circuit 14 coupled to the first subconverter stage 12 to sample an analog input 32. A digital correction unit 18 is coupled to receive a digital output 20 from each of the flash converter stages 12 and provides conversion timing control signals 16 to the stages 12. In this pipelined design, an N-bit binary digital output 22 is produced corresponding to the analog input 32 in X conversion cycles, wherein each stage 12 receives an analog input and provides an M-bit binary digital output 20 and a residue output 44. The digital correction unit 18 receives intermediate M-bit digital signals 20 from each subconverter stage 12 and generates a composite digital output 22 of N bits.

FIG. 1B illustrates one subconverter stage 12 of the A/D system 10, having an M-bit flash A/D converter 36, and an M-bit digital to analog (D/A) converter 38 receiving the binary digital output 20 from the A/D converter 36, and generating an analog output 40. A summation circuit 42 receives the analog output 40 of the D/A converter 38, as well as the stage input 32,44, and generates an output signal 34 representing the difference between the stage input 32,44 and the D/A output 40. The difference or error signal 34 is then amplified by an amplifier 46 to provide a stage residue output signal 44 that is provided to the next cascaded flash converter stage 12. Because the residue output 44 corresponds to the remainder signal that cannot be resolved by the M-bit stage 12, the gain for the amplifier 46 is set to $2^{(M-1)}$, such that the input signal 44 uses the full range of the subsequent stage 12.

FIG. 1C further illustrates the M-bit flash type A/D converter 36 of the stage 12, comprising a resistive voltage divider 50 generating $2^M$ reference voltages between first and second references V+ and V−, respectively. The reference voltages are supplied as first inputs to a corresponding set of $2^M$ comparators 52, with the stage input 32,44 being simultaneously applied to the second comparator inputs. The digital output 20 is determined as an M-bit binary representation 20 of the stage input voltage 32, 44 using output logic 54. The comparators 52 are typically fabricated using metal oxide semiconductor (MOS) transistors to achieve relatively high switching speeds and lower power consumption than bipolar designs. However, these conventional pipelined flash converter systems 10 still occupy a relatively large amount of die area, due at least in part to the provision of $2^M$ comparator circuits 52 in each stage 12, and the system 10 consumes a considerable amount of power. Accordingly, there remains a need for A/D converters that provide high output resolution fast conversions with low DNL, while consuming little power and taking up little space.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to analog to digital conversion systems (A/D converters or ADCs) in which two or more multi-bit successive approximation register (SAR) subconverter stages are cascaded to form a pipelined conversion system receiving an analog input and providing a digital output. The cascaded SAR stages include capacitor arrays and switching systems to selectively couple the capacitors to array inputs, array outputs, or reference voltages for operation in sample, conversion, and residue amplification modes. The use of pipelined multi-bit SAR stages provides the advantages of high conversion speed and low power consumption, along with reduced die area compared with conventional pipelined flash converters and non-pipelined designs. In one implementation, the SAR subconverter stages are fully differential, wherein the capacitors are switched according to a thermometer code to also reduce converter differential non-linearity (DNL), and the first subconverter stage gain is reduced to improve the conversion system bandwidth.

In accordance with one aspect of the invention, an analog to digital conversion system is provided with cascaded first and second multi-bit SAR subconverter stages, where the first subconverter stage comprises a first switched capacitor system, such as a capacitor array including a plurality of capacitors, with a switching system. The switching system selectively couples individual capacitors to one of a first subconverter stage input node, a first subconverter stage output node, a first reference voltage, and a second reference voltage during sample, conversion, and residue amplification modes. The first subconverter stage receives an analog input signal, and provides a first multi-bit digital output signal representative of the analog input signal. The first stage also provides an analog first subconverter stage residue output signal representative of the difference between the analog input signal and a final value of the first multi-bit digital output signal.

The second SAR subconverter stage comprises a second switched capacitor system including a plurality of capacitors and a switching system to selectively couple individual capacitors to one of a second subconverter stage input node, a second subconverter stage output node, or one of the first and second reference voltages during the sample, conversion, and residue amplification modes. The second stage receives the residue output of the first subconverter stage, and provides a second multi-bit digital output signal representative of the first subconverter stage residue output signal, and a second subconverter stage residue output for a subsequent subconverter stage. The system may further comprise a digital error correction system coupled to the subconverter stages that receives the multi-bit digital output signals and provides a system digital output signal.

In another aspect of the invention, the first digital output signal comprises J bits, where J is an integer greater than 1, wherein the first stage has a residue output gain factor less than $2^{(J-1)}$. Conventional pipelined converters, such as that of FIGS. 1A–1C, provide a first stage gain of $2^{(J-1)}$, wherein the first stage's bandwidth limits the conversion speed of the entire conversion system. The inventor has appreciated that reducing the gain factor for the first SAR stage (e.g., below $2^{(J-1)}$) facilitates improved system bandwidth, wherein the second stage can be made with an increased gain factor to compensate for the reduced range in the first residue output signal. For example, where the second stage digital output comprises K bits (e.g., K being an integer greater than 1), the second subconverter stage gain factor is made to be greater than $2^{(K-1)}$ in one implementation of the invention.

In yet another aspect of the invention, the subconverter stage capacitors have substantially equal capacitance values (e.g., not binary weighted), wherein the switching systems selectively couple the individual capacitors according to an intermediate digital signal in a thermometer code. The inventor has found that switching a capacitor array using thermometer coding reduces differential non-linearity (DNL) compared with systems that switch capacitors of different sizes (e.g., values) in and out in changing between digital values. The use of thermometer coding in the SAR subconverter stage intermediate digital signals ensures that only one capacitance value is being changed in a transition from one code to the next, wherein system DNL is reduced in comparison with conventional binary coding techniques.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 1A is a schematic diagram illustrating a conventional pipelined analog to digital (A/D) converter employing flash type subconverter stages;

FIG. 1B is a schematic diagram further illustrating one flash type subconverter stage in the pipelined A/D converter of FIG. 1A;

DETAILED DESCRIPTION OF THE INVENTION

Figure 1C:
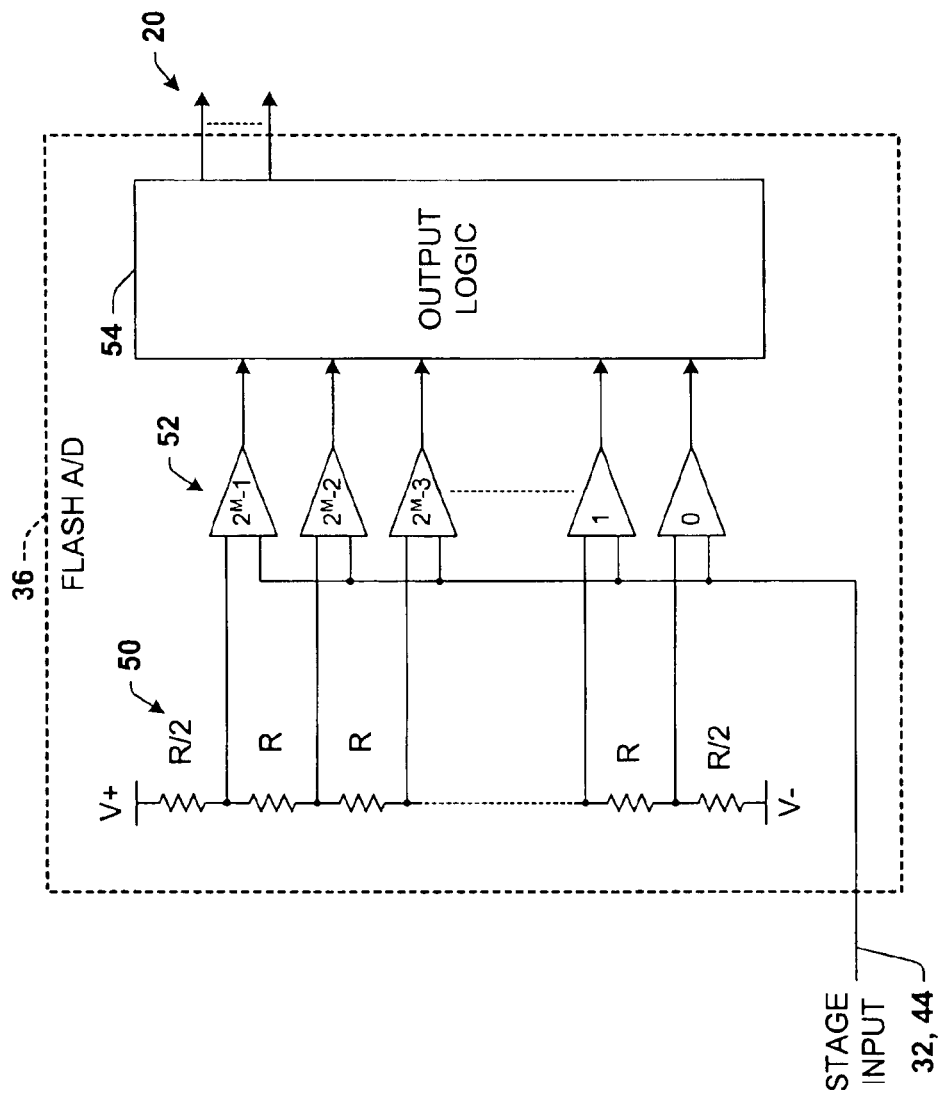
FIG. 1C is a schematic diagram illustrating a conventional flash A/D converter used in the system of FIGS. 1A and 1B.

One or more exemplary implementations of the present invention will now be described with reference to the attached drawings, wherein like reference numerals are used to refer to like elements throughout. The invention relates to pipelined analog to digital conversion systems with cascaded multi-bit SAR subconverter stages that provide a digital output representative of a system analog input. Several exemplary fully differential A/D converters are illustrated and described hereinafter, wherein the various aspects of the invention may also be employed in conjunction with single-ended conversion systems.

Referring initially to FIGS. 2A–2F, an exemplary pipelined AND conversion system 110 is illustrated, having a plurality of cascaded subconverter stages 112, including a first subconverter stage 112a receiving an analog input 132. A digital correction unit 118 provides conversion control signals 116 to the subconverter stages 112 and receives a digital output 120 from each of the stages 112 to provide an error corrected N-bit binary digital output 122 corresponding to the analog input signal voltage 132. Each of the cascaded stages 112 receives an analog subconverter stage input signal (e.g., a voltage) 132,144 and provides an M-bit digital output 120. The stages 112 further provide an analog residue output 144 corresponding to the difference between the stage input signal 132,144 and the stage digital output 120.

In a conversion system within the scope of the invention, the subconverter stages 112 may individually provide any number of output bits greater than 1, and the stages 112 may, but need not, have the same number of output bits. In an exemplary 12-bit implementation of the conversion system 110, an integer number "i" stages 112 are provided, wherein the first three stages 112 each provide an M-bit digital output (e.g., i=4, M=3 in this example), and the last stage 112 provides 6 bits to the digital correction unit 118. The digital correction unit 118 receives the subconverter stage digital outputs 120 from each subconverter stage 112 and generates a digital output of N bits, wherein N=12 in this example.

Figure 2A:
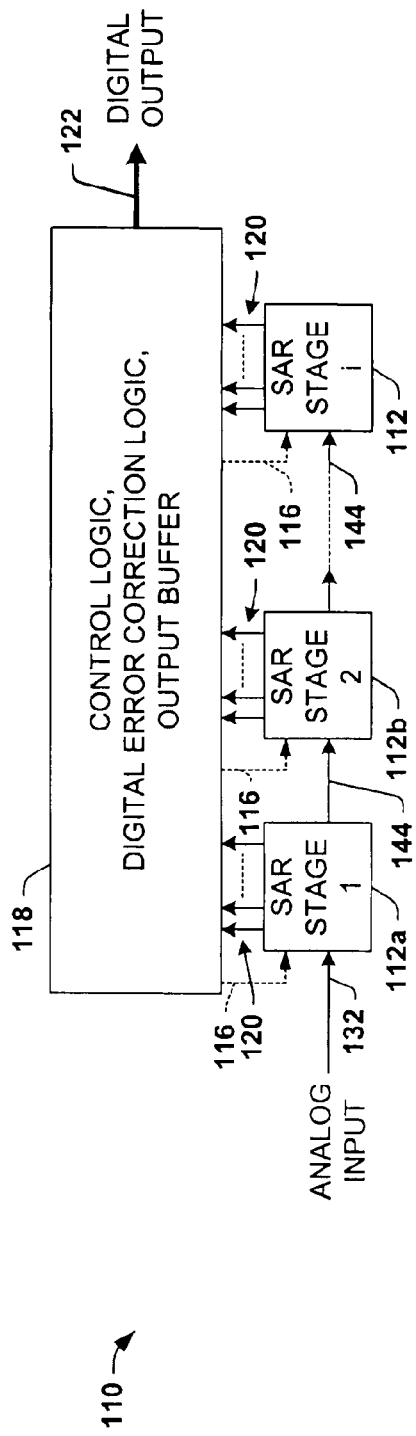
FIG. 2A is a schematic diagram illustrating an exemplary pipelined fully differential A/D converter employing multi-bit successive approximation register (SAR) subconverter stages in accordance with the present invention.
Figure 2B:
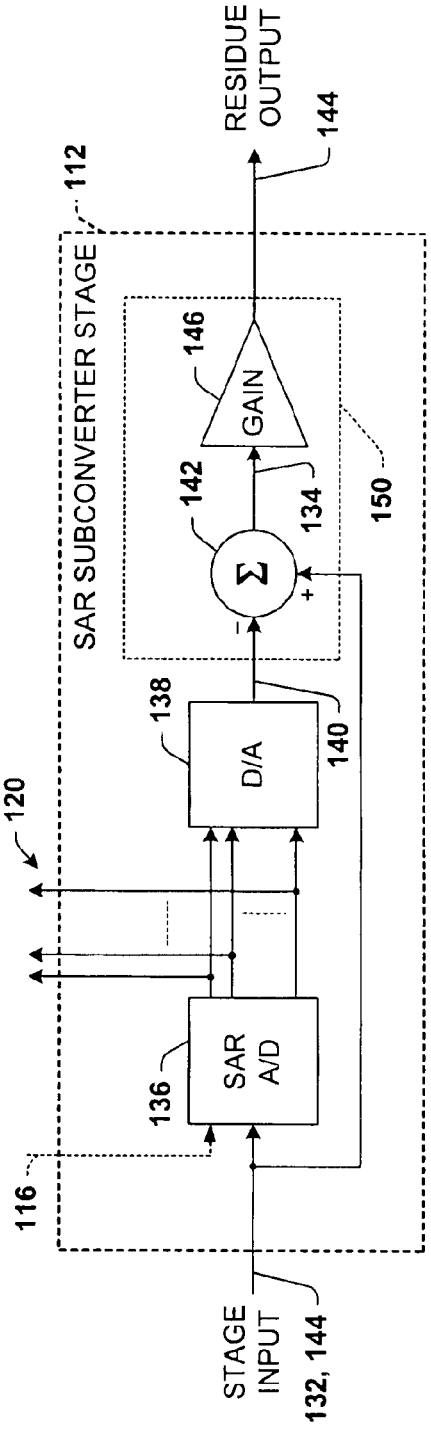
FIG. 2B is a simplified schematic diagram illustrating an exemplary SAR type subconverter stage in the pipelined A/D converter of FIG. 2A.

A simplified schematic representation of one of the 3-bit subconverter stages 112 of the A/D system 110 is provided in FIG. 2B, having an M-bit successive approximation register (SAR) A/D converter 136, and an M-bit digital to analog (D/A) converter 138. The D/A converter 138 receives the digital output 120 from the A/D converter 136, and provides a corresponding analog output 140. Since the illustrated stage 112 in FIG. 1B provides only M-bit conversion, the analog output 140 is subtracted from the stage input 132,144 via a summation circuit 142 to produce an output 134 indicating the remaining or residual error or difference. The signal 134 is amplified by a gain stage 146 to produce a stage residue output signal 144 that is provided to the next cascaded converter stage 112, wherein the summation 142 and the gain stage 146 may be implemented as a single component 150, such as a difference amplifier circuit.

Figure 2C:
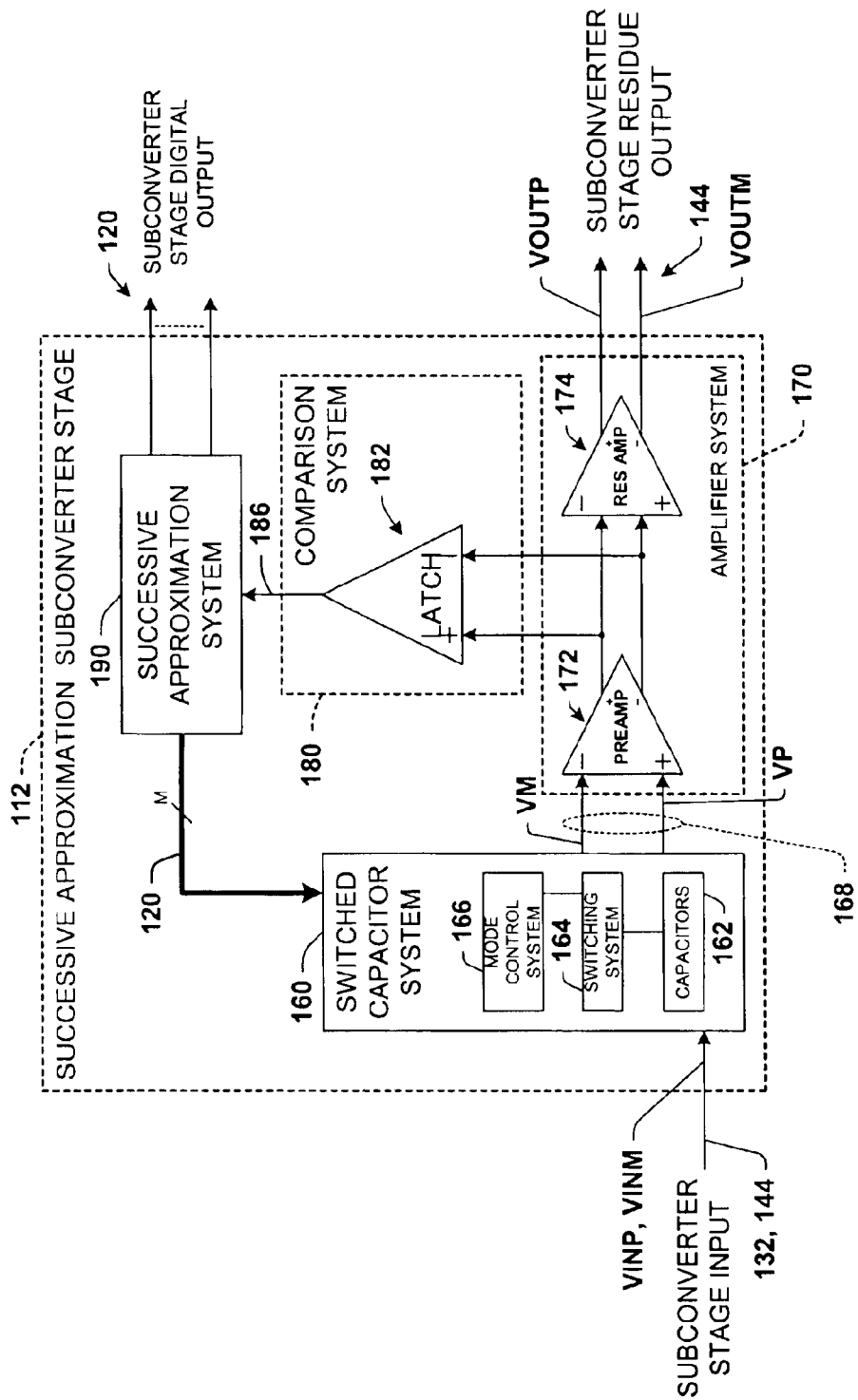
FIG. 2C is a more detailed schematic diagram illustrating an exemplary SAR A/D subconverter stage in the conversion system of FIG. 2A.
Figure 2D:
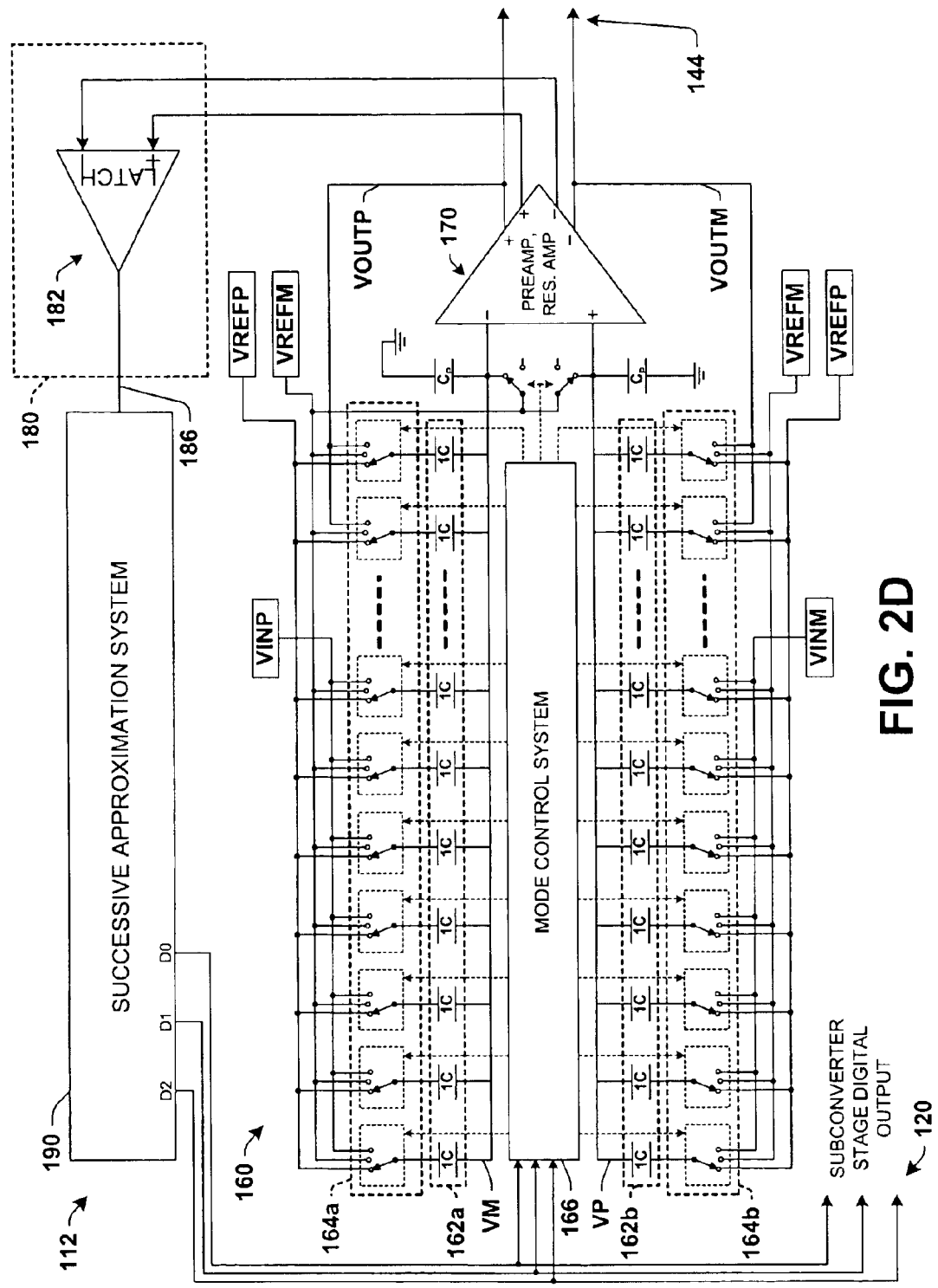
FIG. 2D is a detailed schematic diagram illustrating an exemplary SAR type subconverter stage with a differential switched capacitor array and switching system, along with a mode control system in accordance with an aspect of the invention.
Figure 2F:
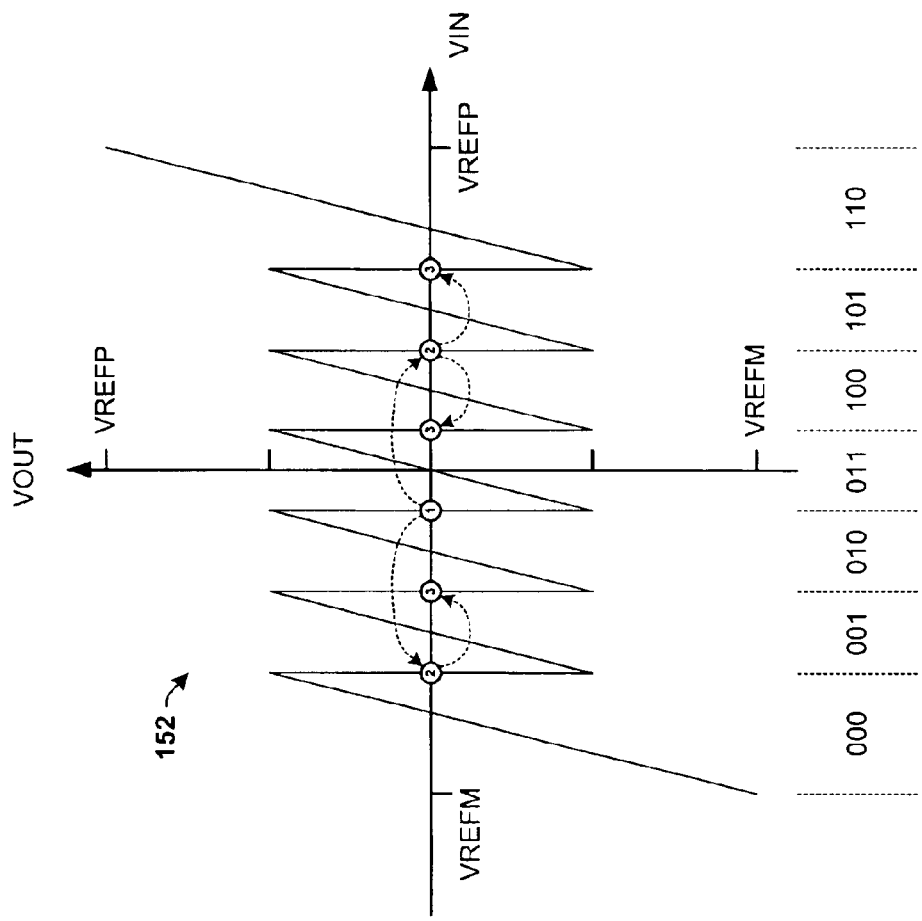
FIG. 2F is a plot illustrating an analog to digital conversion transfer function for an exemplary 3-bit SAR subconverter stage.

The individual SAR subconverter stages 112 are operable in sampling, conversion, and residue amplification modes according to control signals 116 from the digital correction and control unit 118, wherein FIG. 2F illustrates a transfer function 152 (VOUT vs. VIN) for an exemplary 3-bit SAR subconverter stage 112 during conversion mode. In the sampling mode, the SAR A/D 136 in FIG. 2B receives the stage input voltage 132,144, which is then iteratively quantized in the conversion mode. As illustrated in FIG. 2F, an initial approximation (e.g., mid-scale binary 011) is used in the SAR A/D 136 to estimate the value of the stage input 132,144 (circled "1" in FIG. 2F). The initial approximation is refined, for example, wherein the sign of the comparison signal 134 is used in a second iteration to determine whether the estimate is raised or lowered to better approximate the stage input 132,144. One of the two possibilities (e.g., 001 or 101) is thus determined (e.g., circled "2" in FIG. 2F), and provided by the SAR A/D 136. In this regard, the second estimate adjusts the initial approximation by an amount of 2 (e.g., binary 010).

A comparison of the updated D/A output 140 and the input 132,144 is made, and the approximation is again adjusted in accordance with the comparison (e.g., to one of the circled "3" values in FIG. 2F). In the case of a 3-bit stage 112, three approximations are all that is needed. Once a final digital output value 120 has been obtained through successive approximation in the conversion mode, the difference between the input signal 132,144 and the final digital value (e.g., output signal 134) is amplified by a gain factor to produce the residue output 144 (e.g., residue amplification mode). As discussed below, one aspect of the invention provides for reducing the residue amplification gain factor of the first stage 112a below $2^{(J-1)}$, where the first stage 112a provides a J-bit digital output 120.

Figure 2E:
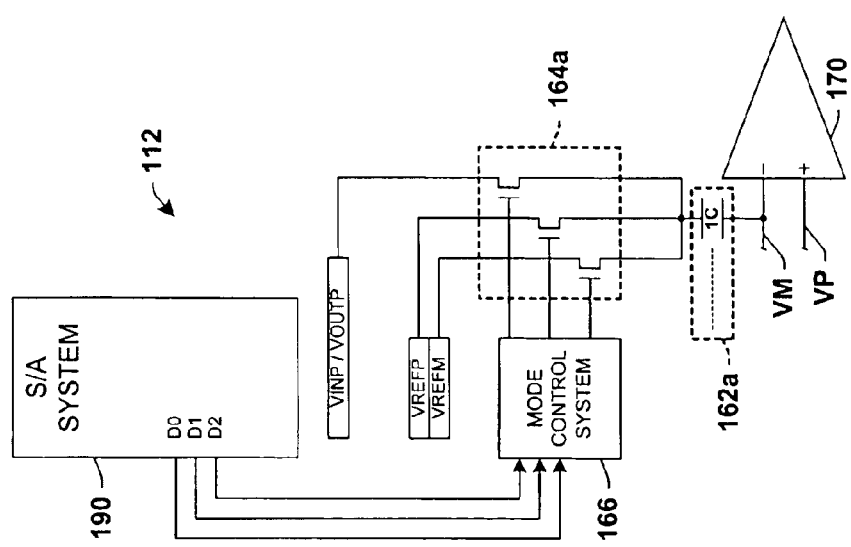
FIG. 2E is a schematic diagram illustrating a portion of the exemplary differential subconverter switched capacitor system of the SAR subconverter stage of FIG. 2D.

According to another aspect of the invention, switched capacitor systems are employed in implementing the SAR subconverter stages, with switching apparatus for selectively coupling array capacitors in sample, conversion, and residue amplification modes. FIGS. 2C–2E illustrate an exemplary, fully differential, M-bit SAR type A/D subconverter stage 112 that may be employed in the A/D conversion system 110 or other converters in accordance with the invention. The exemplary subconverter stage 112 comprises a switched capacitor system 160 with a plurality or array of capacitors 162, a switching system 164, and a mode control system 166. The capacitor array 162 may include any type and size of capacitors, arranged in any configuration within the scope of the invention, including segmentation into two sub arrays 162a and 162b for fully differential systems (FIG. 2D), wherein parasitic capacitance between switched capacitor system intermediate nodes VM and VP and system ground are illustrated herein as Cp. In one preferred implementation, the capacitors 162 are of equal size, although binary weighted capacitors or other size arrangements are possible within the scope of the invention.

The switching system 164 comprises switching elements, such as transistors or other components, that are configured to selectively couple individual ones of the capacitors with various signals and/or reference voltages within the subconverter stage 112, depending upon the mode (e.g., sample mode, conversion mode, or residue amplification mode). The switch components of the switching system 164 are actuated or operated via switch control signals from the mode control system, which may be implemented using any suitable logic circuitry or other components operative to provide the switching functions described herein. In particular, logic circuitry in the exemplary mode control system 166 selectively provides for switching the capacitor couplings depending upon whether the subconverter stage 112 is in the sample, conversion, or residue amplification mode.

The stage 112 also comprises an amplifier system 170 receiving a differential signal from the switched capacitor system 160 at differential intermediate nodes VM and VP 168. The exemplary amplifier system 170 includes a preamp stage 172 producing a differential preamp output signal for a residue amplifier stage 174 that provides an amplified differential residue output signal 144 at switched capacitor system output nodes VOUTP and VOUTM for the following stage 112. The preamp output is also provided to a comparison system 180 in the subconverter stage 112. Other amplifier systems and circuits 170 are possible within the scope of the invention, including single and/or multistage configurations, wherein the amplifier system may be constructed using any suitable operational amplifier or other type circuitry.

The differential output of the preamp 172 is provided to a comparison system 180, that comprises a latch circuit 182 providing an output 186 indicative of the polarity of the differential preamp output signal. The conversion system output 186 is provided to a successive approximation (S/A) system 190, which in turn provides the intermediate M-bit digital values 120 (e.g., iterative approximations or estimates) to the switched capacitor system 160 during conversion mode. During SAR conversion mode, the S/A system 190 generates an initial digital output 120, and then adjusts the output 120 according to the output 186 of the conversion system 180. For an M-bit subconverter stage 112, M such approximations are provided by the S/A system 190, after which the final digital value 120 is provided to the switched capacitor system 160 during the residue amplification mode. The S/A system 190 also provides a final digital output 120 (e.g., also M-bit binary) to the subconverter stage digital output correction unit 118 (FIG. 2A) at the end of the iterative conversion mode and/or in the residue amplification mode.

In operation, the switched capacitor system 160 receives an analog subconverter stage input voltage 132,144 at the differential switched capacitor system input nodes VINP and VINM, and receives an intermediate digital signal 120 from the S/A system 190 (e.g., D0, D1, and D2 in the illustrated 3-bit example). The switched capacitor system 160 provides an analog switched capacitor system intermediate signal 168 at the intermediate nodes VM and VP. As illustrated in FIG. 2D, the capacitors comprise first terminals coupled to one of the differential switched capacitor system intermediate nodes VM and VP (e.g., which are shared by the exemplary capacitor and amplifier systems 160 and 170 in this example), as well as second terminals coupled with the transistor switches of the switching system 164. Referring also to FIG. 2E, the mode control system 166 selectively provides control signals to the switching system 164 depending upon the particular mode of the subconverter stage 112 and the values of the intermediate digital signal from the successive approximation system 190.

In this manner, the switching system 164 selectively couples individual capacitors in the array 162 to the switched capacitor system input node (VINP or VINM), the switched capacitor system output node (VOUTP or VOUTM), a first reference voltage (VREFP), or a second reference voltage (VREFM). The reference voltages may be of the same or different polarities or one may be a ground. Some of the capacitors are coupled with the inputs VINP, VINM during sampling mode, and some are coupled with the outputs VOUTP, VOUTM to operate as feedback capacitors during residue amplification mode. Furthermore, in the conversion and residue amplification modes, certain of the capacitors in the array 162 are selectively coupled to either the first or the second references VREFP, VREFM depending upon the desired inter-stage gain and the current digital output value 120. In this particular implementation, the digital signal 120 is provided by the S/A system 190 to the mode control system 166 in conversion and residue amplification modes, and the mode control system 166 causes certain of the capacitors to be coupled with one of the references VREFP, VREFM according to the state of the digital signals D0, D1, and D2.

Figure 3A:
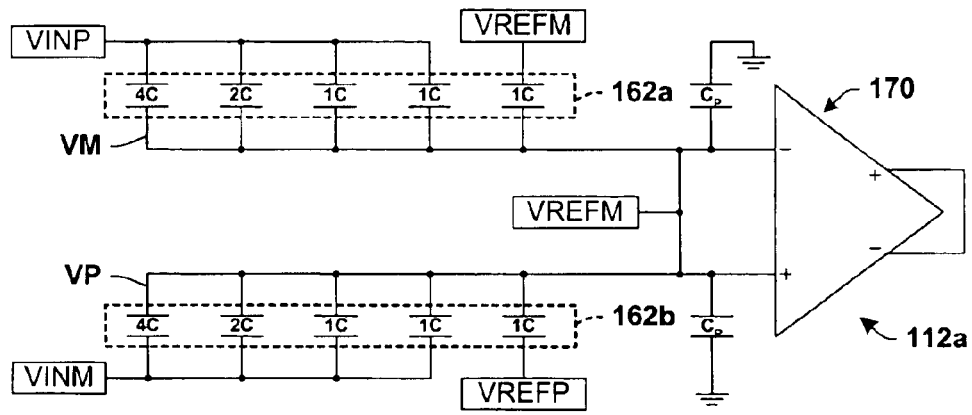
FIG. 3A is a schematic diagram illustrating an exemplary SAR type subconverter stage with a differential switched capacitor system operating in an input sampling mode in accordance with the invention.
Figure 3B:
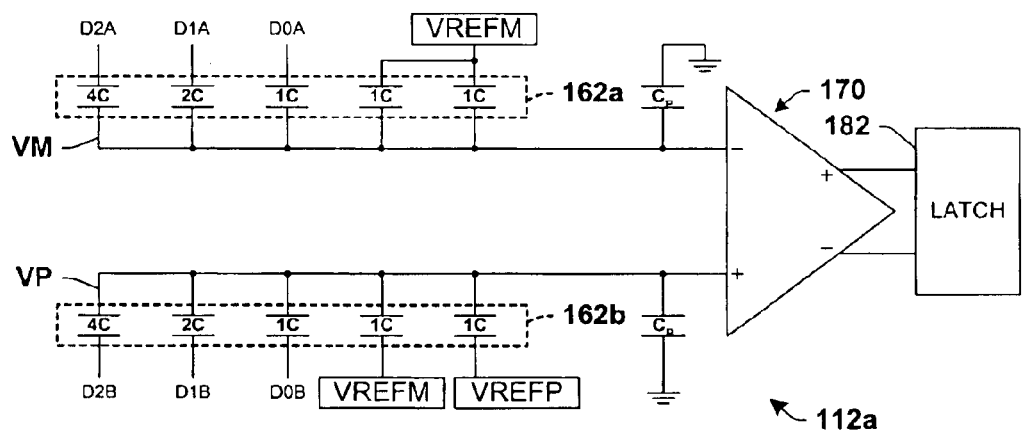
FIG. 3B is a schematic diagram illustrating the SAR subconverter stage of FIG. 3A operating in a SAR conversion mode in accordance with the invention.
Figure 3C:
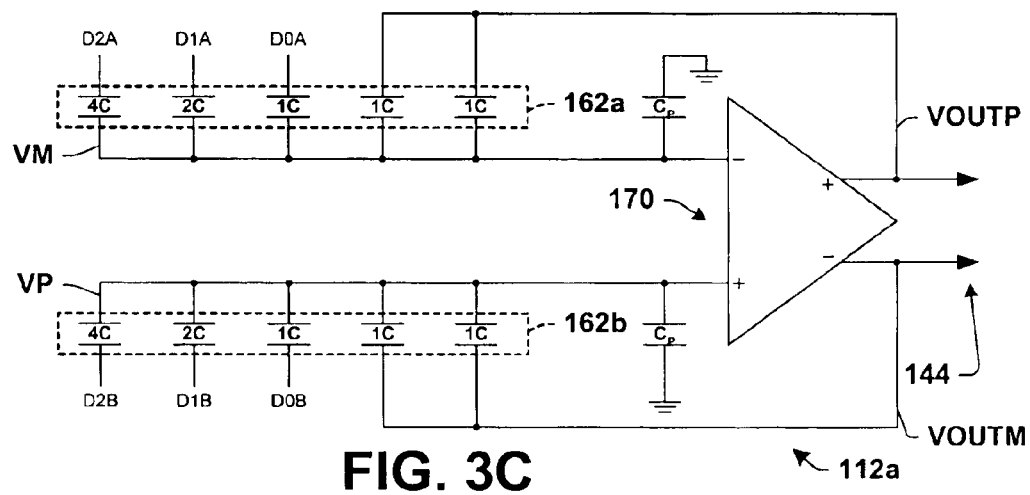
FIG. 3C is a schematic diagram illustrating the SAR subconverter stage of FIGS. 3A and 3B operating in a residue amplification mode in accordance with the invention.

FIGS. 3A–3C illustrate operation of the subconverter stages 112 in simplified form in the sample, conversion, and residue amplification modes, respectively, for the case where certain of the capacitors in the array 162 are binary weighted. In these figures, and in FIGS. 4A–4C, 5A–5C, and 6A–6C below, the digital input values D0, D1, and D2 are illustrated as being logically coupled with certain of the array capacitors. However, as illustrated in FIG. 2E, the logical states of the digital signals D0, D1, and D2 are provided to these capacitors by selective coupling to one of the reference voltages VREFP or VREFM by the mode control system 166 and the switching system 164, according to the logical states of the digital signals D0, D1, and D2, wherein the digital signal values D0, D1, and D2 are provided to the mode control system 166.

Referring to FIG. 3A, in the sample mode, the switched capacitor system 162 stores the differential subconverter stage input voltage 132,144 in the plurality of capacitors 162. In this implementation, a total of 8 unit capacitance values (e.g., 4C+2C+1C+1C) are coupled between each of the input nodes VINP, VINM and the corresponding intermediate nodes VM and VP, respectively, with the nodes VM and VP being coupled to the second reference voltage VREFM during sample mode.

Successive approximation (SAR) conversion mode operation is illustrated in FIG. 3B, wherein the switched capacitor system 160 applies the intermediate digital signal D0, D1, and D2 to the plurality of capacitors 162 and provides the switched capacitor system output signal to the latch 182 in the comparison system 180 via the preamp stage 172 of the amplifier system 170. During conversion mode, the S/A system 190 iteratively refines the estimate or approximation of the correct digital value 120 according to the resulting latch output signal 186, using three iterations in the exemplary 3-bit implementation, as described above in association with FIG. 2F.

It is noted that because some of the capacitors have been precharged according to the input signal 132,144 (e.g., in the sampling mode of FIG. 3A), the subsequent application of the digital input values D0, D1, and D2 to the array 162 allows the array 162 and the amplifier system 170 to cooperatively function as both a D/A converter (e.g., like converter 138 in FIG. 2B) and also as a difference amplifier (e.g., like the summation circuit 142 in FIG. 2B). In this manner, as illustrated in FIGS. 2C and 2D, the preamp output signal provided to the latch 182 represents the difference between the subconverter stage input voltage 132,144 and the current value of the intermediate digital signal D0, D1, D2 from the S/A system 190 during conversion mode. In the conversion mode of FIG. 3B, the differential voltage at the intermediate nodes VP and VM is given by the following equation (1):

$$VP-VM-Vos=[8C/(9C+Cp)][(VINP-VINM)-(2D-7)(VREFP-VREFM)/8]-Vos, \quad (1)$$

where Vos is the offset voltage at the input of the preamp 172 and D is the decimal value of the 3-bit intermediate digital signal 120 (D0, D1, and D2).

Referring also to FIG. 3C, in the residue amplification mode, the final value of the intermediate digital signal 120 is provided to the capacitor array 162 (e.g., by the switching system 164 coupling the appropriate capacitors to one of the reference voltages VREFP or VREFM). In addition, certain of the capacitors are coupled between the intermediate nodes VM or VP and the amplifier output nodes VOUTP or VOUTM, respectively, to operate as feedback capacitors. In this example, at least one of the array capacitors is coupled with the switched capacitor system input node (e.g., VINP)

in the sampling mode (FIG. 3A), with one of the first and second reference voltages (e.g., VREFM) in the conversion mode (FIG. 3B), and with the switched capacitor system output node (VOUTP) in the residue amplification mode (FIG. 3C).

Using certain ones of the capacitors in a feedback path between the switched capacitor system output at VOUTP and VOUTM and the intermediate nodes VM and VP, respectively, the amplifier system 170 amplifies the switched capacitor system output signal by a gain factor to provide a differential analog subconverter stage residue output signal 144 at VOUTP and VOUTM. In this manner, the switched capacitor system 160 provides the switched capacitor system output signal at VOUTP and VOUTM that is representative of a difference between the subconverter stage input voltage 132,144 and the final value of the intermediate digital signal D0, D1, and D2 in residue amplification mode. In the 3-bit subconverter stage example of FIGS. 3A–3C, the first stage 112a provides a residue amplification gain factor of 4. In the residue amplification mode of FIG. 3C, the differential voltage at the switched capacitor system output nodes VOUTP and VOUTM is given by the following equation (2):

$$VOUTP-VOUTM=4[(VINP-VINM)-(2D-6)(VREFP-VREFM)/8-(9C+Cp)(Vos/8C)], \quad (2)$$

where D is the decimal value of the final digital signal 120 (D0, D1, and D2). It is noted that the digital error correction system 118 in the conversion system 110 corrects for the effects of parasitic capacitances Cp and the offset voltage Vos since the offset voltage and parasitic capacitance effects operate to shift the transfer function by a constant amount.

Referring now to FIGS. 4A–4C and 5A–5C, another aspect of the invention provides for reducing the gain of the first subconverter stage 112a, and optionally increasing the gain of the second stage 112b. In prior flash pipelined converters, the gain for an M-bit subconverter stage is typically set at $2^{(M-1)}$. For a three bit subconverter stage 12 in FIG. 1B, the unamplified residue range will generally be on the order of ¼ of the stage input range, wherein the conventional pipelined converter stage 12 amplifies the residue by a gain factor of 4 to utilize the full input range of the subsequent subconverter stage. Due to the iterative nature of SAR type converters, these have previously not been considered for high-speed data conversion applications. However, the inventor has appreciated that in high-speed conversion applications, the residue amplifier bandwidth of the first stage may limit the conversion speed, where the bandwidth dictates the amount of time required for the amplifier system (e.g., system 170) to settle.

The inventor has also found that the settling time is particularly limiting for the first subconverter stage 112 in the pipelined SAR converter implementation of the invention. In the example of FIGS. 4A–4C and 5A–5C, the first interstage gain factor is advantageously reduced to below $2^{(M-1)}$ (e.g., less than 4 in this case), and the second interstage gain factor is increased above $2^{(M-1)}$ (e.g., above 4) for the cascaded first and second stages 112a and 112b, respectively. The remaining subconverter stages 112 may include similar gain adjustments or may be configured to provide the gain factor as $2^{(M-1)}$, where M is the number of bits in a particular subconverter stage 112. This aspect of the invention is also applicable where the various stages have different bit counts. In general, where a first subconverter stage S/A system 190 provides a J-bit subconverter stage digital output signal (e.g., J being an integer greater than 1), the corresponding gain factor for the first subconverter stage 112a is less than $2^{(J-1)}$ in accordance with this aspect of the invention. The second stage gain may be increased, either for the sampling mode, the conversion mode and/or for the residue amplification mode, regardless of whether the first and second stages 112a and 112b are of the same number of bits. For example, where the second S/A system 190 provides a K-bit subconverter stage digital output signal, the gain factor for the second subconverter stage may be greater than $2^{(K-1)}$. In the illustrated example, J=K=3, wherein the first gain factor is less than 4 (e.g., 2) and the second gain factor is greater than 4 (e.g., 8).

Figure 4A:
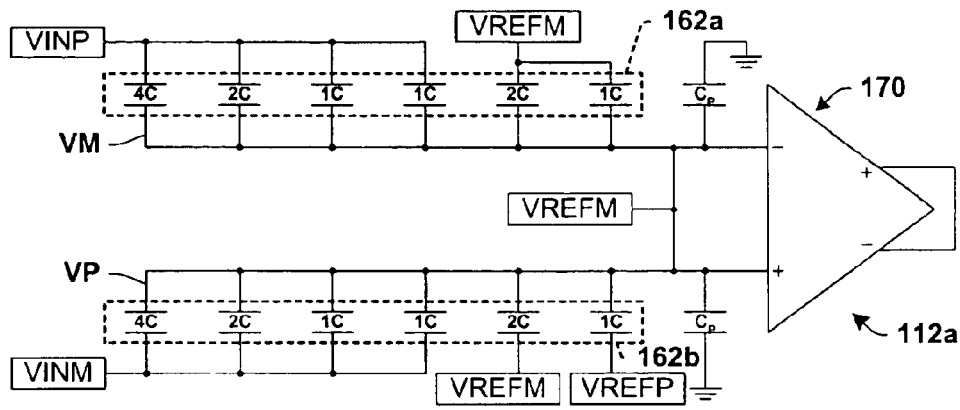
FIGS. 4A–4C are schematic diagrams illustrating an exemplary first SAR subconverter stage with a reduced gain in accordance with another aspect of the invention, shown operating in sampling, conversion, and residue amplification modes, respectively.
Figure 4B:
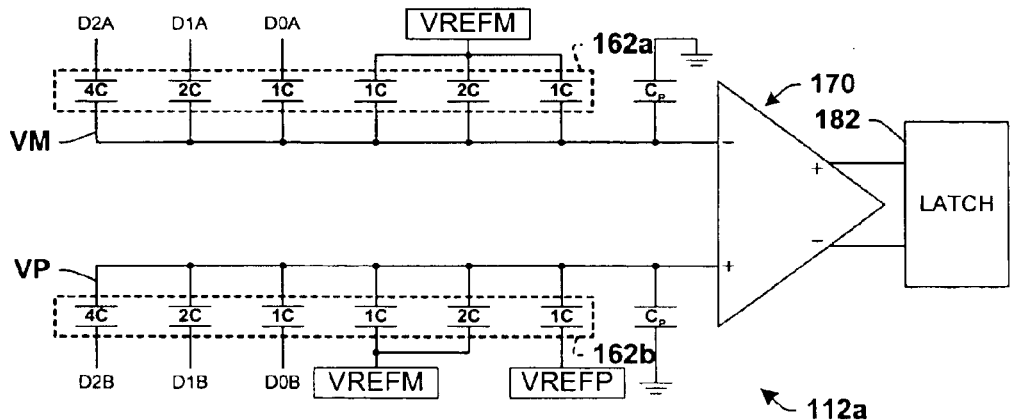
Figure 4C:
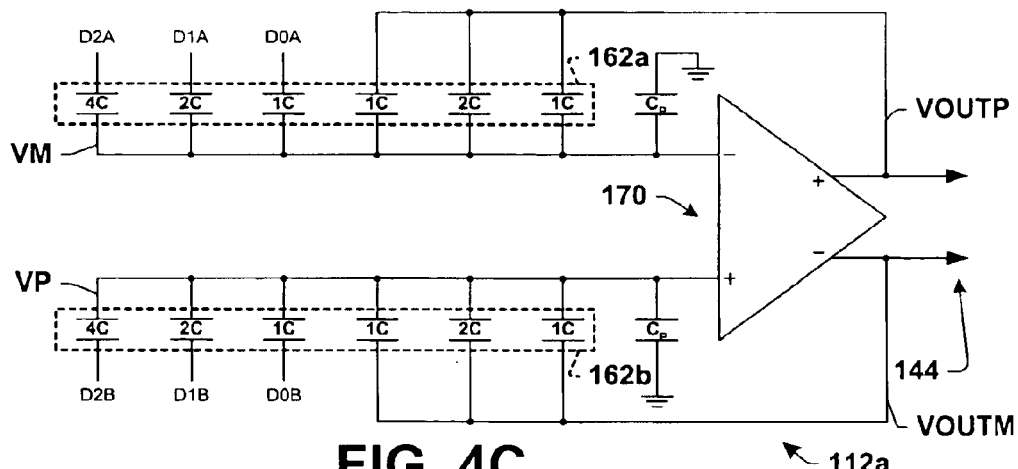
Figure 5A:
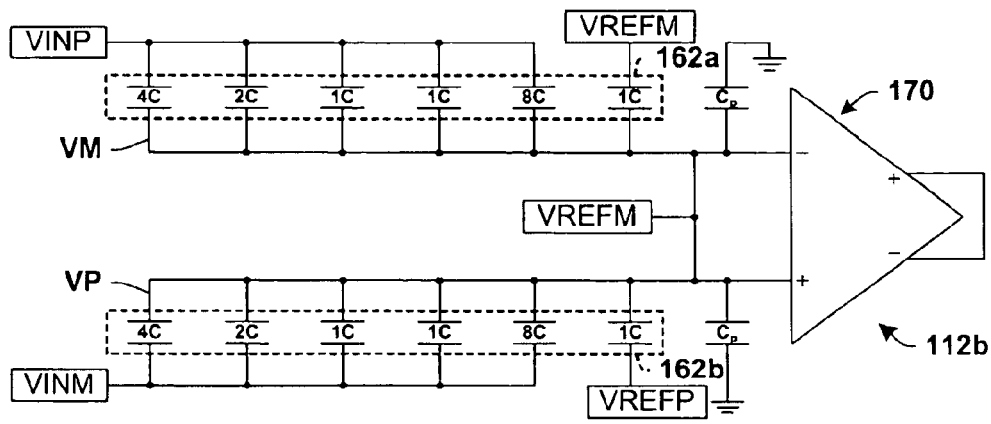
FIGS. 5A–5C are schematic diagrams illustrating an exemplary second SAR subconverter stage with an increased gain for receiving a residue output from the first stage of FIGS. 4A–4C operating in sampling, conversion, and residue amplification modes, respectively.
Figure 5B:
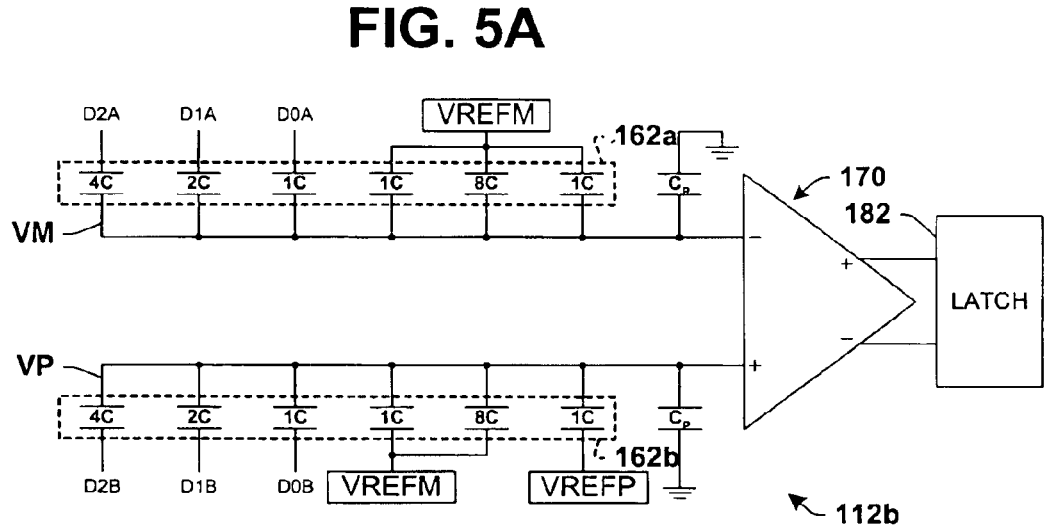
Figure 5C:
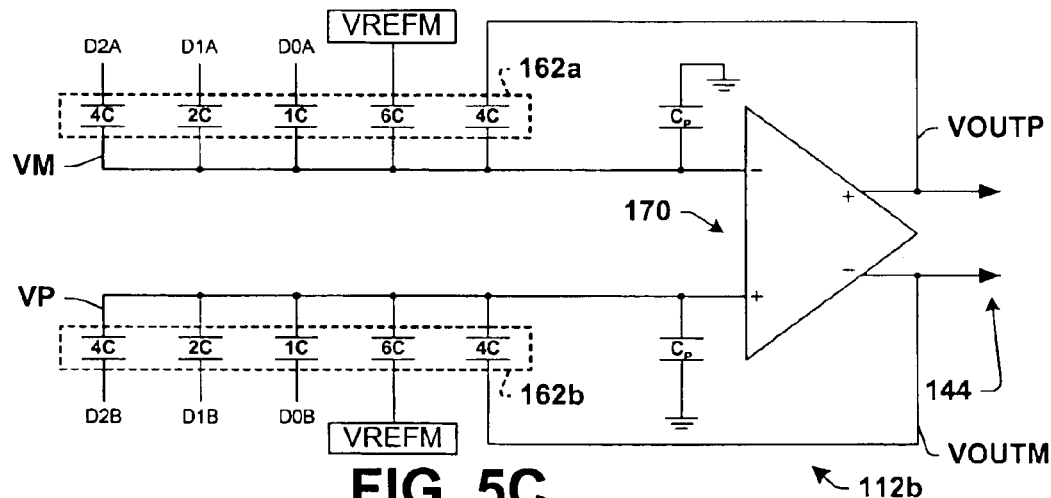

As illustrated and described below with respect to FIGS. 4A–4C, the first stage gain factor may be selectively reduced through selective coupling of the capacitors 162, to improve conversion speed by increasing the system bandwidth. FIGS. 4A–4C illustrate an implementation of the first subconverter stage 112a providing a first gain factor of 2 in the conversion system 110 of FIG. 2A, wherein FIG. 4A illustrates sample mode, FIG. 4B illustrates SAR conversion mode, and FIG. 4C illustrates residue amplification mode. In this manner, the bandwidth capabilities of the conversion system 110 are improved generally in proportion to the amount of gain reduction. FIGS. 5A–5C illustrate a corresponding implementation of the second subconverter stage 112b providing a second gain factor of 8 (in conversion mode) in the conversion system 110, in which FIG. 5A illustrates sample mode, FIG. 5B illustrates SAR conversion mode, and FIG. 5C illustrates residue amplification mode.

Referring initially to FIG. 4A, in the sample mode, the switched capacitor system 162 of the first stage 112a stores the conversion system analog input 132 from the input nodes VINP and VINM into the capacitor array 162. In this example, as with the above example of FIG. 3A, a total of 8 unit capacitance values are coupled between each of the input nodes VINP, VINM and the corresponding intermediate nodes VM and VP, respectively, and the nodes VM and VP are coupled to VREFM. In SAR conversion mode (FIG. 4B), the intermediate digital signal D0, D1, and D2 is provided to the capacitor array 162 and the switched capacitor system output signal is applied to the latch 182 via the amplifier system 170. Comparing FIGS. 3B and 4B, during conversion mode in FIG. 4B, a total of 4 unit capacitances are coupled between VREFM and the intermediate node VM, whereas in FIG. 3B, only 2 unit capacitances are so coupled. With respect to the intermediate node VP, 3 unit capacitances are coupled between VP and VREFM in FIG. 4B, whereas in FIG. 3B, only 1 unit capacitance is so coupled. Again, the S/A system 190 iteratively refines the estimate or approximation of the correct digital value 120 according to the resulting latch output signal 186, using three iterations. In the conversion mode of FIG. 4B, the differential voltage at the intermediate nodes VP and VM is given by the following equation (3):

$$VP-VM-Vos=[8C/(11C+Cp)][(VINP-VINM)-(2D-7)(VREFP-VREFM)/8]-Vos. \quad (3)$$

Referring now to FIG. 4C, in the residue amplification mode for the first subconverter stage 112a, the final value of the intermediate digital signal 120 is provided to the capacitor array 162, and certain of the capacitors are coupled so as to operate as feedback capacitors. In FIG. 4C, 4 unit capacitances are coupled as feedback between each of the intermediate nodes VM, VP and the corresponding output nodes VOUTP, VOUTM, respectively, whereas only 2 unit capacitances were used as feedback components in FIG. 3C. Accordingly, the implementation of the first stage 112a in FIGS. 4A–4C provides a residue amplification gain factor of only 2, wherein the differential voltage at the switched capacitor system output nodes VOUTP and VOUTM is given by the following equation (4):

$$VOUTP-VOUTM=2[(VINP-VINM)-(2D-6)(VREFP-VREFM)/8-(11C+Cp)(Vos/8C)]. \quad (4)$$

As with the other stages 112, the digital error correction system 118 compensates for the effects of the offset voltage Vos and the parasitic capacitance Cp. Although the residue output uses only half of the available input range for the next stage 112b, the second stage 112b has an increased (e.g., doubled) gain to account for this effect.

Referring also to FIGS. 5A–5C, an exemplary second subconverter stage 112b is illustrated in simplified form for sample, conversion, and residue amplification modes, respectively, wherein a second gain factor of 8 is provided in accordance with the invention. In the sample mode (FIG. 5A), the switched capacitor system 162 of the second stage 112b stores the first residue output 144 of the first stage 112a into the second stage capacitor array 162. During input sampling in the second stage 112b, a total of 16 unit capacitance values are coupled between each of the input nodes VINP, VINM and the corresponding intermediate nodes VM and VP, respectively, with the nodes VM and VP being coupled to VREFM.

In SAR conversion mode (FIG. 5B), the intermediate digital signal is provided to the capacitor array 162 and the output signal is applied to the latch 182. During conversion mode in FIG. 5B, a total of 10 unit capacitances are coupled between VREFM and the intermediate node VM, and 9 unit capacitances are coupled between VP and VREFM, whereby the full range of the amplifier 170 is used in the second stage 112b. The S/A system 190 iteratively refines the estimate or approximation of the correct digital value 120 according to the resulting latch output signal 186, using three iterations, wherein the conversion mode differential voltage at the intermediate nodes VP and VM is given by the following equation (5):

$$VP-VM-Vos=[16C/(17C+Cp)][(VINP-VINM)-(2D-7)(VREFP-VREFM)/16]-Vos. \quad (5)$$

In the residue amplification mode for the second subconverter stage 112b (FIG. 5C), the final value of the intermediate digital signal 120 is provided to the capacitor array 162, wherein 4 unit capacitances are coupled for amplification feedback. Thus configured, the second stage 112b provides a residue amplification gain factor of 8, wherein the differential voltage at the output nodes VOUTP and VOUTM is given by the following equation (6):

$$VOUTP-VOUTM=8[(VINP-VINM)-(2D-6)(VREFP-VREFM)/16-(17C+Cp)(Vos/16C)]. \quad (6)$$

Referring now to FIGS. 6A–6D, another aspect of the present invention involves the employment of thermometer coding in the intermediate digital signals 120 generated by the S/A system 190 during conversion and residue amplification modes, together with capacitor arrays 162 in which the capacitors are of substantially equal capacitance values. SAR converters typically employ binary coding to implement digital to analog conversion functions. However, the inventor has appreciated that differential nonlinearity (DNL) performance of such converters suffers, due to the component switching of binary weighted circuit components. For A/D converters, DNL is a measurement of the error between consecutive codes in the converter digital output, wherein a zero DNL corresponds to a single least significant bit (1 LSB) difference between consecutive codes and a DNL of less than +/−1 LSB is generally desirable to ensure converter monotonicity.

In the context of the exemplary switched capacitor systems 160 of the present invention, DNL relates to the variance in capacitance values from the desired or target value. In a binary weighted capacitor array, such as the capacitors 4C, 2C, and 1C coupled with the digital signal D2, D1, and D0 above (e.g., FIGS. 3A–3C), the capacitance of each of these components may vary according to a normal distribution, within manufacturing and design tolerance ranges. In changing from a 3-bit binary 2 to a 3, (e.g., from 010 to 011), only one component is changed, whereas changing from a 3 to a 4, (e.g., from 011 to 100) involves switching out capacitors having values of 1 and 2 unit capacitances, and switching in a capacitor of 4 unit capacitances. For a 3-bit binary coded system, the maximum unit capacitance mismatch is 12.5% to ensure +/−1 LSB DNL, where 3×2.646 deviations is <99%, with 7 unit capacitance values being switched for the worst case change from binary coded 3 to binary coded 4.

However, the inventor has appreciated that using a switched capacitor system with capacitors of a single capacitance value selected according to a thermometer coded digital signal allows individual capacitor deviations of as much as 33% to meet the same +/−1 LSB DNL target. In this regard, using a thermometer code for the intermediate and final digital value 120 provided to the switched capacitor system 160 ensures that only one component is changed in the array 162 between successive output codes. The final subconverter stage digital output 120 provided to the digital correction system 118 may be thermometer coded or may be in any code form (e.g., binary) in implementations of this aspect of the invention.

It is noted at this point that the above implementations, including those where selective gain reduction or increase is provided in the first and/or second subconverter stages, may be implemented using binary weighted capacitors and/or by using equally valued capacitors with thermometer coded digital signals, as illustrated in FIGS. 6A–6D. In this regard, the invention contemplates pipelined A/D conversion systems employing multi-bit SAR subconverter stages alone or in combination with the thermometer coding and gain factor adjustment aspects of the invention, wherein all combined or separate implementations of these aspects are contemplated as falling within the scope of the invention and the appended claims.

Figure 6A:
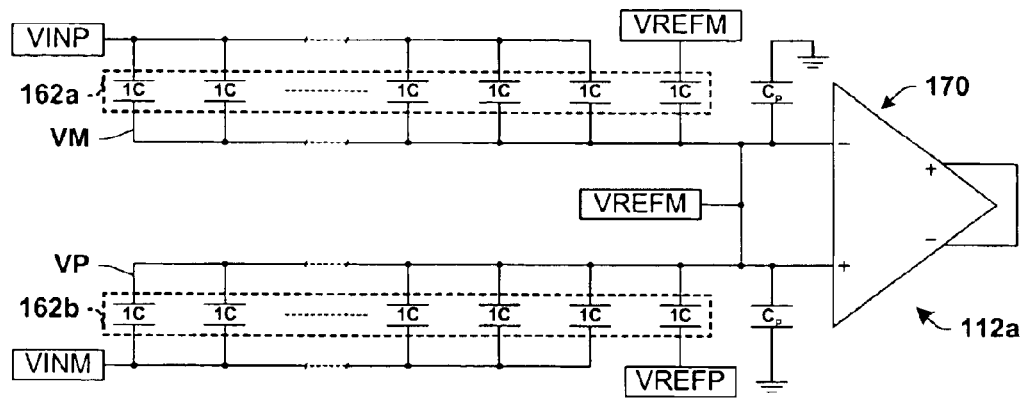
FIGS. 6A–6C are schematic diagrams illustrating another exemplary first SAR subconverter stage employing thermometer coding in accordance with yet another aspect of the invention, shown operating in sampling, conversion, and residue amplification modes, respectively.
Figure 6B:
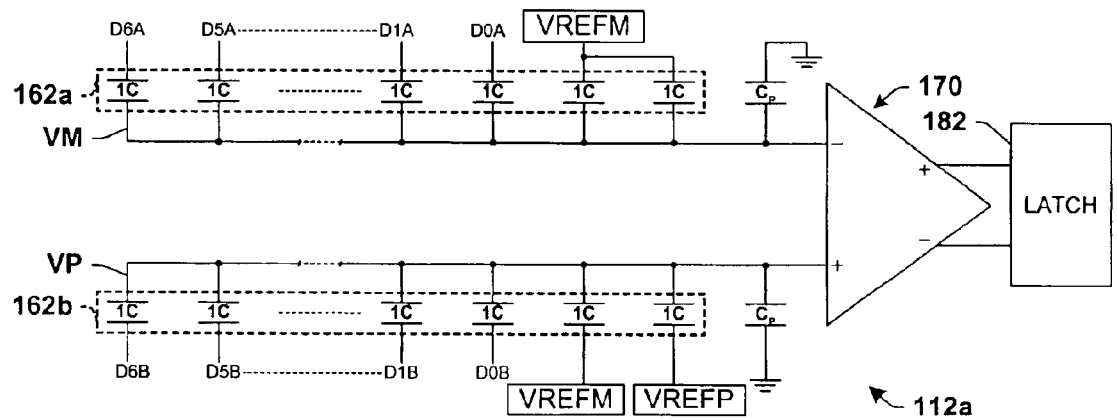
Figure 6C:
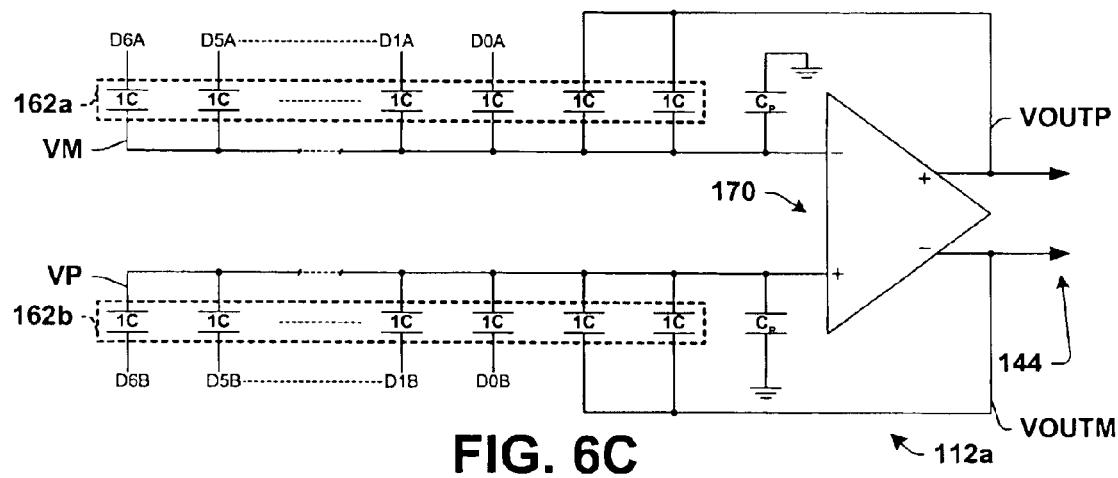
Figure 6D:
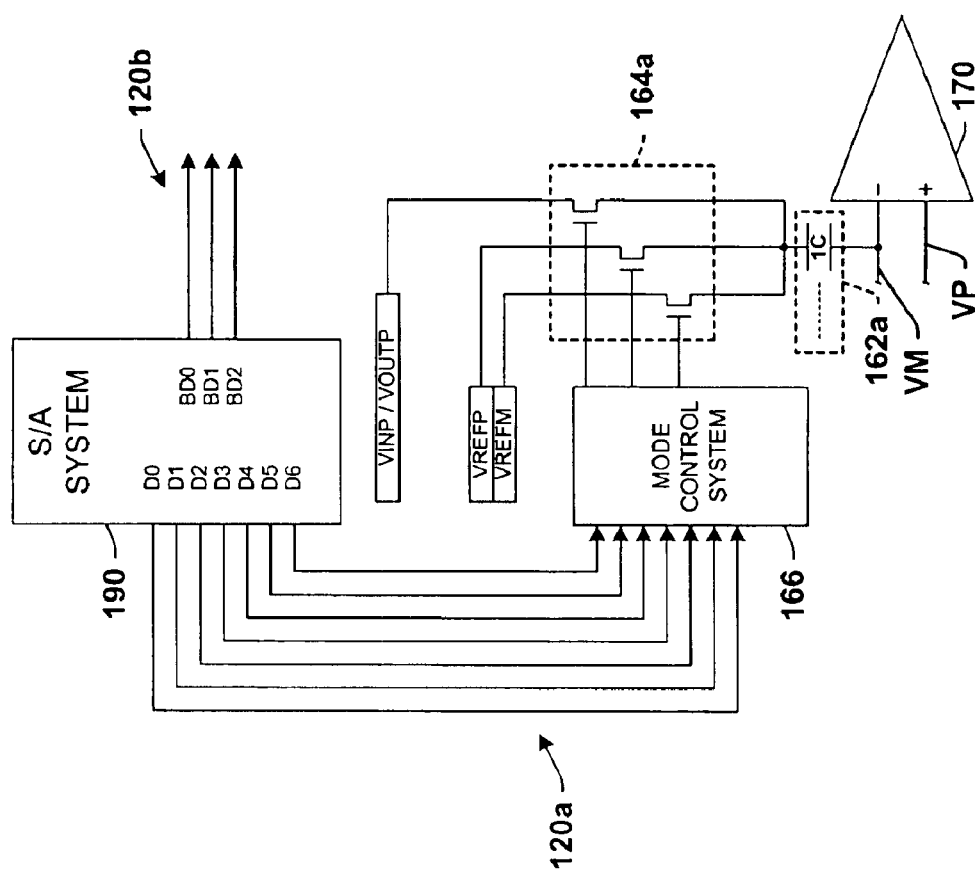
FIG. 6D is a schematic diagram illustrating a portion of the exemplary subconverter differential switched capacitor system of the SAR subconverter stage of FIGS. 6A–6C.

FIGS. 6A–6C illustrate another exemplary first subconverter stage 112a for sample, conversion, and residue amplification modes, respectively, and FIG. 6D illustrates the use of thermometer coding in a modified S/A system 190 and mode control system 166 in the pipelined conversion system 110 in accordance with the invention. The switched capacitor system 160 includes a capacitor array 162 comprising a plurality of capacitors having substantially equal capacitance values, wherein the application of the intermediate digital code 120 to the capacitor array 162 is done as a thermometer code. In the sample mode (FIG. 6A), the switched capacitor system 162 stores the subconverter stage analog input signal voltage 132,144 in the capacitor array 162, with 8 array capacitors coupled between VINP and VM and 8 capacitors between VINM and VP, where the nodes VM and VP are coupled to VREFM.

FIG. 6B illustrates conversion mode, in which the S/A system 190 provides a thermometer coded intermediate digital signal 120 to the mode control system 166. The control system 166 provides corresponding switching signals to the switching system 164 to selectively couple certain of the capacitors to one of VREFP or VREFM according to the thermometer code digital signal. Referring also to FIG. 6D, although the simplified illustration of FIG. 6B illustrates this operation schematically by showing the thermometer code signals D0–D6 being coupled directly to the second terminals of some of the capacitors, the capacitor terminals in the exemplary stage 112 are actually coupled with three switches in the switching system 164 for selective coupling to VINP/VOUTP, VREFP, or VREFM. In this implementation, the S/A system 190 may provide a thermometer coded intermediate digital signal 120a to the mode control system 162 and a corresponding binary coded signal 120b (e.g., BD0, BD1, and BD2) to the digital error correction system 118 (FIG. 2A). Alternative implementations are possible, for example, wherein the subconverter stage digital output 120b may also be provided in the form of a thermometer code.

With the intermediate (thermometer coded) digital signal thus applied to the capacitor array 162, the amplifier system 170 provides the preamp output signal to the latch 182 of the comparison system 180. The S/A system 190 iteratively refines the digital signal approximation D0–D6 according to the resulting latch output signal 186, using three iterations for the illustrated example, wherein the conversion mode differential voltage at the intermediate nodes VP and VM is given by the following equation (7):

$$VP-VM-Vos=[8C/(9C+Cp)][(VINP-VINM)-(2D-7)(VREFP-VREFM)/8]-Vos. \quad (7)$$

FIG. 6C illustrates the residue amplification mode for the thermometer code subconverter stage 112a, in which the final value of the intermediate digital signal 120 is provided to the capacitor array 162, with 2 unit capacitances being used in each feedback path for amplification by the system 170 (the illustrated implementation shows a residue amplification gain of 4 for the first stage 112a). In this implementation, the differential output voltage at the nodes VOUTP and VOUTM is given by the following equation (8):

$$VOUTP-VOUTM=4[(VINP-VINM)-(2D-6)(VREFP-VREFM)/8-(9C+Cp)(Vos/8C)]. \quad (8)$$

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. An analog to digital conversion system, comprising:
a plurality of cascaded successive approximation subconverter stages, each subconverter stage receiving a subconverter stage analog input signal and providing a subconverter stage digital output signal representative of the subconverter stage analog input signal, the plurality of successive approximation subconverter stages individually comprising:
a switched capacitor system receiving an analog subconverter stage input voltage at a switched capacitor system input node and receiving a thermometer coded intermediate digital signal, the switched capacitor system providing an analog switched capacitor system output signal at a switched capacitor system output node, wherein the switched capacitor system comprises:
a plurality of capacitors having substantially equal capacitance values, individual capacitors comprising a first terminal and a second terminal; and
a switching system coupled to the second terminals of the plurality of capacitors, the switching system selectively coupling individual capacitors to one of the switched capacitor system input node, the switched capacitor system output node, a first reference voltage, and a second reference voltage according to the thermometer coded intermediate digital signal.

2. The analog to digital conversion system of claim 1, wherein:
in a sample mode, the switched capacitor system stores the subconverter stage input voltage in the plurality of capacitors;
in a conversion mode, the switched capacitor system applies the intermediate digital signal to the plurality of capacitors and provides the switched capacitor system output signal representative of a difference between the subconverter stage input voltage and a value of the intermediate digital signal; and
in a residue amplification mode, the switched capacitor system provides the switched capacitor system output signal representative of a difference between the subconverter stage input voltage and a final value of the intermediate digital signal.

3. The analog to digital conversion system of claim 1, wherein the analog to digital conversion system receives a differential conversion system analog input signal, wherein the individual switched capacitor systems receive a differential analog subconverter stage input voltage at first and second switched capacitor system input nodes and provide a differential analog switched capacitor system output signal at first and second switched capacitor system output nodes, and wherein the switched capacitor systems individually comprise:
a first plurality of capacitors individually comprising a first terminal and a second terminal coupled to the switching system; and
a second plurality of capacitors individually comprising a first terminal and a second terminal coupled to the switching system.

4. The analog to digital conversion system of claim 1, wherein the subconverter stages individually further comprise:
an amplifier system coupled with the switched capacitor system, the amplifier system amplifying the switched capacitor system output signal and providing an analog subconverter stage residue output signal according to the switched capacitor system output signal;

a comparison system coupled with the amplifier system and providing a comparison signal according to the switched capacitor system output signal; and a successive approximation system coupled with the switched capacitor system and the comparison system, the successive approximation system providing the thermometer coded intermediate digital signal and a subconverter stage digital output signal according to the comparison signal;

wherein in the conversion mode, the successive approximation system iteratively adjusts the value of the thermometer coded intermediate digital signal according to the comparison signal; and wherein in the residue amplification mode, the amplifier system amplifies the switched capacitor system output signal by a gain factor using at least one capacitor from the plurality of capacitors to provide an analog subconverter stage residue output signal.

5. The analog to digital conversion system of claim 4, wherein a first subconverter stage receives a conversion system analog input signal as the subconverter stage input voltage, wherein the successive approximation system provides a J-bit subconverter stage digital output signal, J being an integer greater than 1, and wherein the gain factor for the first subconverter stage is less than $2^{(J-1)}$.

6. The analog to digital conversion system of claim 5, wherein a second subconverter stage receives an analog subconverter stage residue output signal from the first subconverter stage, wherein the successive approximation system of the second subconverter stage provides a K-bit subconverter stage digital output signal, K being an integer greater than 1, and wherein the gain factor for the second subconverter stage is greater than $2^{(K-1)}$.

7. The analog to digital conversion system of claim 4, wherein the analog to digital conversion system receives a differential conversion system analog input signal, wherein the individual switched capacitor systems receive a differential analog subconverter stage input voltage at first and second switched capacitor system input nodes and provide a differential analog switched capacitor system output signal at first and second switched capacitor system output nodes, and wherein the switched capacitor systems individually comprise:

a first plurality of capacitors individually comprising a first terminal and a second terminal coupled to the switching system; and a second plurality of capacitors individually comprising a first terminal and a second terminal coupled to the switching system.

8. The analog to digital conversion system of claim 4, wherein the switched capacitor systems individually further comprise a mode control system coupled with the switching system, the mode control system providing thermometer coded control signals to the switching system to selectively couple individual capacitors to one of the switched capacitor system input node, the switched capacitor system output node, the first reference voltage, and the second reference voltage in the sample, conversion, and residue amplification modes.

9. The analog to digital conversion system of claim 8, wherein at least one of the capacitors is coupled with the switched capacitor system input node in the sampling mode, with one of the first and second reference voltages in the conversion mode, and with the switched capacitor system output node in the residue amplification mode.

10. The analog to digital conversion system of claim 1, wherein a first subconverter stage receives a conversion system analog input signal as the subconverter stage input voltage, wherein a first subconverter stage provides a J-bit subconverter stage digital output signal, J being an integer greater than 1, wherein in a residue amplification mode, the first subconverter stage amplifies the switched capacitor system output signal by a gain factor using at least one capacitor from the plurality of capacitors to provide an analog subconverter stage residue output signal, and wherein the gain factor for the first subconverter stage is less than $2^{(J-1)}$.

11. The analog to digital conversion system of claim 10, wherein a second subconverter stage receives an analog subconverter stage residue output signal from the first subconverter stage, wherein the second subconverter stage provides a K-bit subconverter stage digital output signal, K being an integer greater than 1, wherein the second subconverter stage amplifies the switched capacitor system output signal by a gain factor using at least one capacitor from the plurality of capacitors to provide an analog second subconverter stage residue output signal, and wherein the gain factor for the second subconverter stage is greater than $2^{(K-1)}$.

12. The analog to digital conversion system of claim 1, further comprising a digital error correction system coupled to the subconverter stages and receiving subconverter stage digital output signals from the subconverter stages, the error correction system providing a conversion system digital output signal according to the subconverter stage digital output signals.

13. A pipelined analog to digital conversion system, comprising:

a first successive approximation subconverter stage comprising a first capacitor array, the first successive subconverter stage receiving a conversion system analog input and providing a first multi-bit subconverter stage digital output representative of the conversion system analog input and a first residue output representative of a difference between the conversion system analog input and the first subconverter stage digital output, wherein the first capacitor array comprises a first plurality of capacitors having substantially equal capacitance values, each comprising a first terminal coupled to a first capacitor array intermediate node, and a second terminal, and wherein the first subconverter stage further comprises a switching system coupled to the second terminals of the plurality of capacitors, the switching system selectively coupling individual capacitors to one of a first capacitor array input node, a first capacitor array output node, a first reference voltage, and a second reference voltage according to a thermometer coded intermediate digital signal; and a second successive approximation subconverter stage comprising a second capacitor array, the second successive subconverter stage receiving the first residue output and providing a second multi-bit subconverter stage digital output representative of the first residue output.

14. A pipelined analog to digital conversion system, comprising:

a first successive approximation subconverter stage comprising a first capacitor array, the first successive subconverter stage receiving a conversion system analog input and providing a first multi-bit subconverter stage digital output representative of the conversion system analog input and a first residue output representative of a difference between the conversion system analog input and the first subconverter stage digital output wherein the first subconverter stage provides a J-bit subconverter stage digital output, J being an integer greater than 1, wherein in a residue amplification mode, the first subconverter stage amplifies the conversion system analog input by a first gain factor to provide the first residue output, and wherein the first gain factor is less than $2^{(J-1)}$; and a second successive approximation subconverter stage comprising a second capacitor array the second successive subconverter stage receiving the first residue output and providing a second multi-bit subconverter stage digital output representative of the first residue output.

15. The conversion system of claim 14, wherein the second subconverter stage provides a K-bit subconverter stage digital output, K being an integer greater than 1, wherein the second subconverter stage amplifies the first residue output by a second gain factor to provide an analog second subconverter stage residue output signal, and wherein the second gain factor is greater than $2^{(K-1)}$.

16. The conversion system of claim 14, wherein the analog to digital conversion system receives a differential conversion system analog input, and wherein the individual subconverter stages receive a differential analog subconverter stage input voltage at first and second input nodes and provide a differential analog subconverter stage output at first and second subconverter stage output nodes.

17. The conversion system of claim 14, further comprising a digital error correction system coupled to the subconverter stages and receiving the multi-bit subconverter stage digital outputs from the subconverter stages, the error correction system providing a conversion system digital output signal according to the subconverter stage digital outputs.

18. A pipelined analog to digital conversion system, comprising:

a first successive approximation subconverter stage comprising a first capacitor array, the first successive subconverter stage receiving a conversion system analog input and providing a first multi-bit subconverter stage digital output representative of the conversion system analog input and a first residue output representative of a difference between the conversion system analog input and the first subconverter stage digital output; and a second successive approximation subconverter stage comprising a second capacitor array, the second successive subconverter stage receiving the first residue output and providing a second multi-bit subconverter stage digital output representative of the first residue output and a second residue output representative of a difference between the received first residue output and the second subconverter stage digital output.

* * * * *